(12) United States Patent
Park et al.

(10) Patent No.: US 8,067,285 B2
(45) Date of Patent: Nov. 29, 2011

(54) METHODS OF FORMING A CONDUCTIVE LAYER STRUCTURE AND METHODS OF MANUFACTURING A RECESSED CHANNEL TRANSISTOR INCLUDING THE SAME

(75) Inventors: Jong-Chul Park, Suwon-si (KR); Chan-Mi Lee, Hwaseong-si (KR); Sang-Sup Jeong, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/968,711

(22) Filed: Dec. 15, 2010

(65) Prior Publication Data

US 2011/0151633 A1    Jun. 23, 2011

(30) Foreign Application Priority Data

Dec. 17, 2009   (KR) .................. 10-2009-0125821

(51) Int. Cl.
*H01L 21/336* (2006.01)
*H01L 29/66* (2006.01)

(52) U.S. Cl. ................. 438/270; 257/330; 257/332

(58) Field of Classification Search .............. 257/332, 257/331; 438/270
See application file for complete search history.

(56) References Cited

U.S. PATENT DOCUMENTS

| 6,984,575 B2 * | 1/2006 | Yamamoto | 438/585 |
| 7,154,144 B2 | 12/2006 | Kim et al. | |
| 2005/0020086 A1 * | 1/2005 | Kim et al. | 438/700 |
| 2006/0244055 A1 * | 11/2006 | Jang et al. | 257/330 |
| 2007/0099384 A1 * | 5/2007 | Han et al. | 438/270 |
| 2007/0148876 A1 * | 6/2007 | Yu | 438/275 |
| 2008/0032512 A1 * | 2/2008 | Kim et al. | 438/771 |
| 2008/0128800 A1 * | 6/2008 | Song et al. | 257/330 |
| 2009/0163010 A1 * | 6/2009 | Oh et al. | 438/587 |

FOREIGN PATENT DOCUMENTS

| KR | 10 2005-0011376 A | 1/2005 |
| KR | 10 2008-0003055 A | 1/2008 |
| KR | 10 2008-0077856 A | 8/2008 |

* cited by examiner

*Primary Examiner* — Ha Tran T Nguyen
*Assistant Examiner* — Aaron Dehne
(74) *Attorney, Agent, or Firm* — Lee & Morse, P.C.

(57) ABSTRACT

In a method of forming a conductive layer structure and a method of manufacturing a recess channel transistor, a first insulating layer and a first conductive layer are sequentially formed on a substrate having a first region a second region and the substrate is exposed in a recess-forming area in the first region. A recess is formed in the recess-forming-area by etching the exposed region of the substrate. A second insulating layer is conformally formed on a sidewall and a bottom of the recess. A second conductive layer pattern is formed on the second insulating layer to fill up a portion of the recess. A spacer is formed on the second conductive layer pattern and on the second insulating layer on the sidewall of the recess. A third conductive layer pattern is formed on the second conductive layer pattern and the spacer to fill up the recess.

18 Claims, 9 Drawing Sheets

FIRST REGION | SECOND REGION

FIG. 10

FIRST REGION | SECOND REGION

METHODS OF FORMING A CONDUCTIVE LAYER STRUCTURE AND METHODS OF MANUFACTURING A RECESSED CHANNEL TRANSISTOR INCLUDING THE SAME

BACKGROUND

1. Field

Example embodiments relate to methods of forming a conductive layer structure and methods of manufacturing a recessed channel transistor including the above method. More particularly, example embodiments relate to methods of forming a conductive layer structure including a channel formed along a recess on a substrate and methods of manufacturing a recessed channel transistor including the above method.

2. Description of the Related Art

As semiconductor devices are highly integrated, a gate length of a MOS transistor has been gradually decreased. In order to improve an operating speed and a current driving capacity of the semiconductor devices, a channel length has been decreased to a deep sub-micron degree. As the size of the semiconductor devices decreases, a short channel effect may be frequently generated at the MOS transistor. In this case, controlling the gate may not be appropriately performed.

SUMMARY

Example embodiments provide a method of forming a conductive layer structure including a recess.

Example embodiments provide a method of manufacturing a recess channel transistor having an improved operating characteristic.

According to example embodiments, there is provided a method of forming a conductive layer structure including sequentially forming a first insulating layer and a first conductive layer on a substrate having a first region and a second region and exposing the substrate in a recess-foaming area in the first region, forming a recess in the recess-forming-area by etching the substrate that is exposed in the recess-forming area, conformally forming a second insulating layer on a sidewall and a bottom of the recess, forming a second conductive layer pattern on the second insulating layer to fill up a portion of the recess, forming a spacer on the second conductive layer pattern and on the second insulating layer on the sidewall of the recess, and forming a third conductive layer pattern on the second conductive layer pattern and the spacer to fill up the recess.

The second insulating layer may be formed by a plasma oxidation process using at least one oxidizing agent including at least one of oxygen, nitric oxide (NO) and nitrous oxide ($N_2O$) and at least one plasma generating gas including at least one of argon, helium and xenon.

The plasma oxidation process may be performed at a temperature range from a room temperature to about 550° C. and at a pressure range from about 0.01 torr to about 50 torr.

The forming of the spacer may include conformally foaming a third insulating layer on the substrate including the second conductive layer pattern, and forming the spacer on an upper sidewall of the recess by anisotropically etching the third insulating layer until an upper surface of the second conductive layer pattern is exposed. The anisotropic etching may also remove at lest a portion of the second insulating layer.

The method may further include patterning the first conductive layer to remove a portion of the first conductive layer formed in the first region and to form a first conductive layer pattern in the second region.

The forming of the second conductive layer pattern may include forming a second conductive layer on the second insulating layer to fill up the recess, and partially etching the second conductive layer to remove a portion of the second conductive layer formed in the second region and to form the second conductive layer pattern in the first region.

According to example embodiments, there is provided a method of manufacturing a recess channel transistor including sequentially foaming a first insulating layer and a first conductive layer on a substrate having a first region and a second region and exposing the substrate in a recess-forming area in the first region, forming a recess in the recess-forming-area by etching the substrate that is exposed in the recess-forming area, conformally forming a second insulating layer on a sidewall and a bottom of the recess, forming a second conductive layer pattern on the second insulating layer to fill up a portion of the recess, forming a spacer on the second conductive layer pattern and on the second insulating layer on the sidewall of the recess, filling up the recess with a third conductive layer, patterning the third conductive layer and the first conductive layer to form a first gate electrode including the second conductive layer pattern and a third conductive layer pattern in the first region and to form a second gate electrode including a first conductive layer pattern and a fourth conductive layer pattern in the second region, and forming a first source/drain region and a second source/drain region adjacent to the first gate electrode and the second gate electrode, respectively.

The forming of the spacer may include conformally forming a third insulating layer on the substrate including on the second conductive layer pattern; and anisotropically etching the third insulating layer until an upper surface of the second conductive layer pattern is exposed to form the spacer on an upper sidewall of the recess. The anisotropic etching may also remove at least a portion of the second insulating layer.

The method may further include forming a preliminary device isolation layer pattern to define an active region and a field region in the first region, and etching the preliminary device isolation layer pattern to form a device isolation layer pattern having an upper surface lower than the bottom surface of the recess.

The recess may include a first recess having a first width and a second recess having a second width larger than the first width and connected with the first recess.

The forming of the recess may include forming the first recess in the recess-forming-area, forming a passivation layer pattern on an inner sidewall of the first recess and on the first conductive layer, and etching the substrate at the bottom portion of the first recess using the passivation layer pattern as an etching mask to form the second recess.

The forming of the passivation layer pattern may include forming a passivation layer on the inner sidewall of the first recess and on the first conductive layer, and etching the passivation layer through an etch-back process.

The passivation layer may include at least one of silicon oxide and silicon nitride.

The first recess may be formed by a reactive ion etching process.

The second recess may be formed by an isotropic etching process.

The second insulating layer may be formed by a plasma oxidation process.

The plasma oxidation process may be performed by using at least one oxidizing agent including at least one of oxygen, nitric oxide (NO) and nitrous oxide (N₂O) and at least one plasma generating gas including at least one of argon, helium and xenon.

The plasma oxidation process may be performed at a temperature range from a room temperature to about 550° C. and at a pressure range from about 0.01 torr to about 50 torr.

The method may further include removing a portion of the first insulating layer after patterning the third conductive layer and the first conductive layer to form a second gate insulating layer pattern in the second region.

Each of the first source/drain region and the second source/drain region may be formed by a plasma doping process.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE EMBODIMENTS

Korean Patent Application No. 10-2009-0125821, filed on Dec. 17, 2009, in the Korean Intellectual Property Office, and entitled: "Methods of Forming a Conductive Layer Structure and Methods of Manufacturing a Recessed Channel Transistor Including the Same," is incorporated by reference herein in its entirety.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A recess channel array transistor (RCAT) including a recess in a region where the channel of the MOS transistor is to be formed to increase an effective channel length has been developed. The RCAT may be formed by forming a recess on a substrate, forming a gate insulating layer on the sidewalls and the bottom wall of the recess and then filling up the recess with a conductive material to form a gate conductive layer. Hereinafter, example embodiments of methods of manufacturing recess channel transistors will be explained in detail.

Example Embodiment 1

FIGS. 1 to 8 illustrate cross-sectional views relating to a method of manufacturing a recess channel transistor in accordance with Example Embodiment 1.

Figure 1:
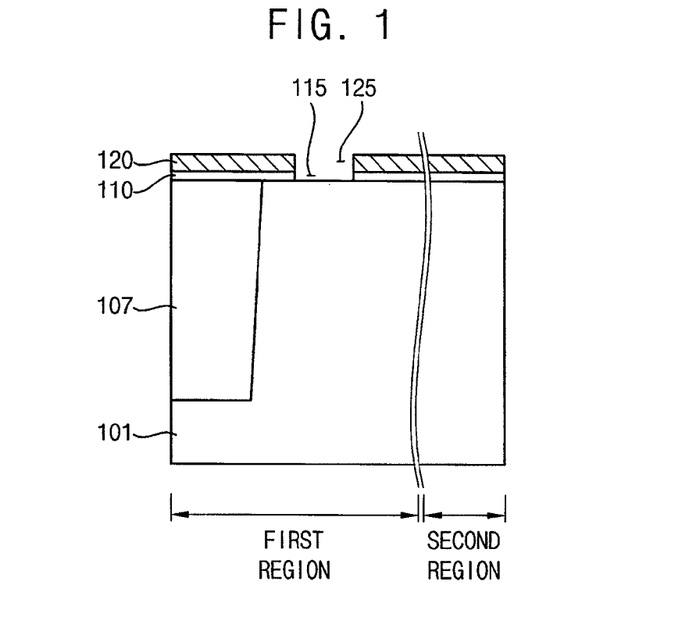
FIGS. 1 to 8 illustrate cross-sectional views relating to a method of manufacturing a recess channel transistor in accordance with Example Embodiment 1.

Referring to FIG. 1, a substrate 101 having a first region and a second region may be provided. In accordance with Example Embodiment 1, the first region of the substrate 101 may be a memory cell region that forms a memory cell and the second region may be a peripheral circuit region that forms peripheral circuits. The first region may include a recess-forming-area where a recess may be subsequently formed.

The substrate 101 may include a semiconductor substrate including silicon, germanium or a compound thereof. The substrate 101 may include a single crystal semiconductor material.

A shallow trench isolation (STI) process may be performed with respect to the substrate 101 to form a device isolation layer pattern 107 in the first region of the substrate 101. A region including the device isolation layer pattern 107 may correspond to a field region and a remainder region from the first region may correspond to an active region. The active region may have an isolated island shape. The field region may have a shape surrounding the active region.

On the substrate 101 including the first and second regions, a first preliminary insulating layer (not shown) and a first preliminary conductive layer (not shown) may be formed sequentially.

The first preliminary insulating layer may include an oxide. When the first preliminary insulating layer is formed using an oxide, the first preliminary insulating layer may be formed through a thermal oxidation process. For example, the first preliminary insulating layer may be formed through a dry oxidation process, a wet oxidation process, a clean oxidation process, a radical oxidation process, etc. The first preliminary insulating layer may be also formed by applying two or more exemplified oxidation processes.

The first preliminary conductive layer may be formed on the first preliminary insulating layer. The first preliminary conductive layer may be formed using polysilicon. When the preliminary conductive layer is formed using polysilicon, a chemical vapor deposition (CVD) process may be applied. For example, the first preliminary conductive layer may be formed by using a silane ($SiH_4$) gas and a phosphine ($PH_3$) gas at a temperature from about 450° C. to about 550° C. In another implementation, the first preliminary conductive layer may be formed through a physical vapor deposition (PVD) process, such as a sputtering process, on the first preliminary insulating layer.

On the first preliminary conductive layer, a first photoresist pattern (not shown) may be formed and the first preliminary conductive layer and the first preliminary insulating layer may be partially etched using the first photoresist pattern as an etching mask. A first insulating layer 110 having a first opening 115 exposing a portion of the substrate 101 corresponding to the recess-forming-area and a first conductive layer 120 having a second opening 125 connected with the first opening 115 may be formed.

The first insulating layer 110 and the first conductive layer 120 may cover the remainder portion of the substrate 101 except for the recess-forming-area of the substrate 101. The first insulating layer 110 provided in the second region may function as a gate insulating layer of a transistor formed in the second region. Therefore, an additional oxidation process for forming the gate insulating layer in the second region of the substrate 101 may be omitted.

If a separate oxidation process to form a gate insulating layer in the second region were to be performed after forming a second conductive layer pattern 150 (refer to FIG. 6, for example) in a recess 130 (refer FIG. 2, for example), an oxide layer may be formed on the second conductive layer pattern 150 in the first region as well as the second region. The oxide layer formed on the second conductive layer pattern 150 may weaken an electric characteristic of a gate electrode formed in the recess 130 positioned in the first region of the substrate 101. Therefore, an additional etching process for removing the oxide layer formed on the second conductive layer pattern 150 may then be necessary. In contrast, in accordance with Example Embodiment 1, an additional oxidation process for forming the gate insulating layer in the second region of the substrate 101 may be omitted and so an additional etching process may be omitted.

Figure 2:
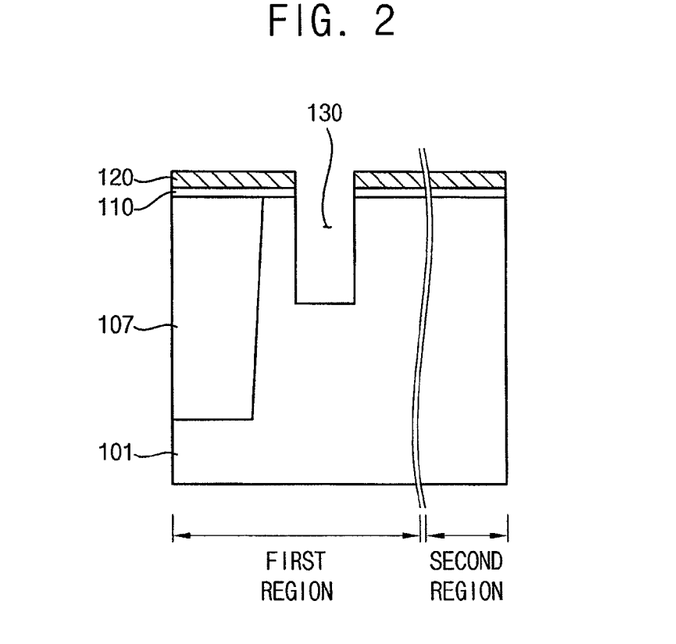

Referring to FIG. 2, the recess 130 may be formed in the recess-forming-area in the first region of the substrate 101 by etching the substrate 101 using the first conductive layer 120 and the first insulating layer 110 as etching masks. For example, the recess 130 may be formed by partially etching the substrate 101 using an anisotropic etching process. Herein, as the recess 130 is partially filled or provided with layers formed on sidewalls in subsequent processes, the term "recess 130" may be used to refer to the remaining space of the recess. As described later, a gate electrode may be formed in the recess 130.

Figure 3:
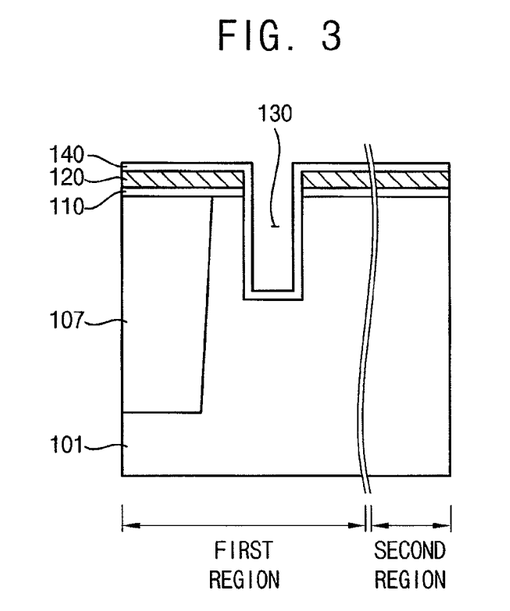

Referring to FIG. 3, a second insulating layer 140 may be formed on the sidewall and the bottom of the recess 130 and on the first conductive layer 120. The second insulating layer 140 may be conformally formed on the sidewall and the bottom of the recess 130 and on the first conductive layer 120. The second insulating layer 140 may be formed using an oxide. When the substrate 101 is formed using silicon, the second insulating layer 140 may include silicon oxide.

The second insulating layer 140 may be formed through a plasma oxidation process in accordance with example embodiments. Examples of oxidizing agents that may be used for the plasma oxidation process may include oxygen, nitric oxide (NO), nitrous oxide ($N_2O$), etc. These compounds may be used alone or as a combination thereof. Examples of gases that may be used for generating plasma may include argon, helium, xenon, etc. These compounds may be used alone or as a combination thereof. The oxidizing agent used during the plasma oxidation process may be electrically neutral or may be in an ionized state.

In accordance with the plasma oxidation process, an oxidation may be completed at a lower temperature than that applied in a common thermal oxidation process. The plasma oxidation process may be performed at a temperature from about a room temperature to about 550° C. For example, the plasma oxidation process may be performed at a temperature from about 300° C. to about 500° C.

The first conductive layer 120 may be formed using polysilicon. When the first conductive layer 120 is formed using polysilicon, an additional crystallization of the first conductive layer 120 during forming the second insulating layer 140 on the first conductive layer through the oxidation process may be restrained. Also, when a gate electrode is formed in the second region by etching the first conductive layer 120 and a third conductive layer 170 of polysilicon formed on the first conductive layer 120 (refer to FIG. 7, for example), difficulties that may otherwise occur while etching a first conductive layer and a third conductive layer having different crystalline structures may be avoided. Further, difficulties while performing a subsequent plasma doping process for forming a source/drain region in the second region due to the gate electrode including different crystalline structures may be avoided as well.

The plasma oxidation process may be performed at a pressure from about 0.01 torr to about 50 torr. For example, the plasma oxidation process may be performed at a pressure from about 0.5 torr to about 5.0 torr. In accordance with the pressure applied during the plasma oxidation process and the depth of the recess 130, a flowing rate of the introduced oxidizing agent may be controlled. For example, the flowing rate of the oxidizing agent introduced into the lower portion of the recess 130 may be reduced further when the pressure during performing the plasma oxidation process is lowered.

The flowing rate of the oxidizing agent in accordance with the depth of the recess 130 may be controlled by providing vias while performing the plasma oxidation process. That is, the flowing amount of the oxidizing agent introduced into the bottom portion of the recess 130 may be increased by providing vias.

In accordance with example embodiments, the second insulating layer 140 including silicon oxides may be formed by a thermal oxidation process. For example, the second insulating layer 140 may be formed through a dry oxidation process, a wet oxidation process, a clean oxidation process, a radical oxidation process, etc. The second insulation layer 140 may be formed by applying at least one or more of the oxidation processes.

Figure 4:
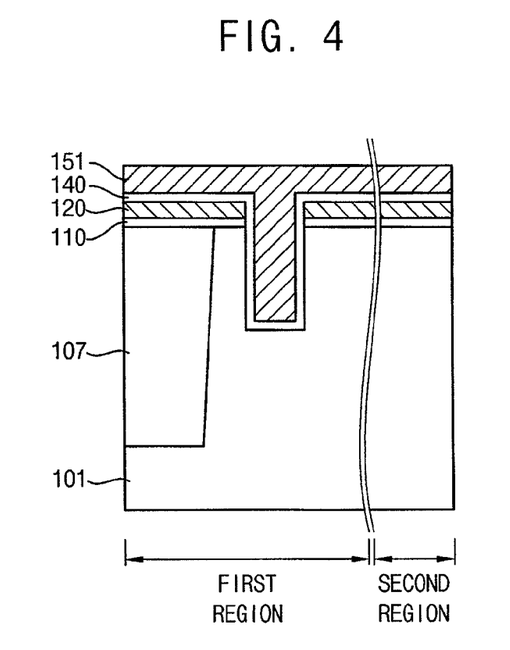

Referring to FIG. 4, a second conductive layer 151 may be formed on the second insulating layer 140 while filling up the recess 130. The second conductive layer 151 formed on the second insulating layer 140 may completely fill up the recess 130. The second conductive layer 151 may be formed using polysilicon.

When the second conductive layer 151 is formed using polysilicon, the second conductive layer 151 may be formed by a chemical vapor deposition process or a plasma enhanced chemical vapor deposition process. For example, the second conductive layer 151 may be formed using a silane (SiH$_4$) gas and a phosphine (PH$_3$) gas at a deposition temperature from about 450° C. to about 550° C. In another implementation, the second conductive layer 151 may be formed through a physical vapor deposition process such as a sputtering process.

Figure 5:
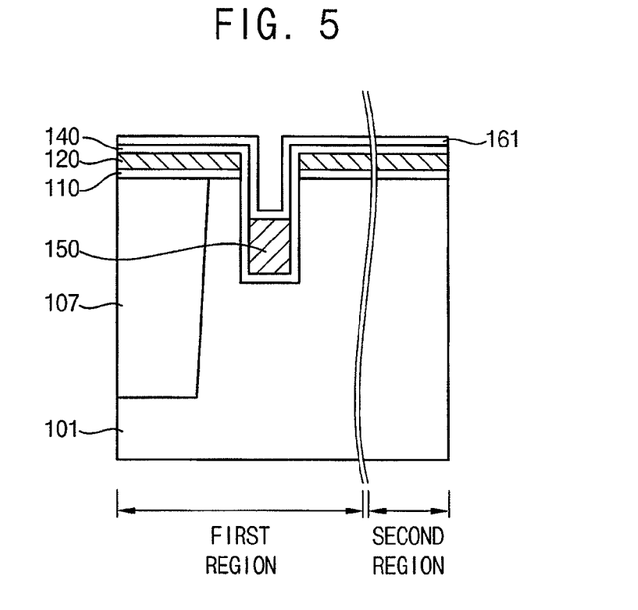

Referring to FIG. 5, the second conductive layer 151 may be etched to form a second conductive layer pattern 150 selectively filling up the bottom portion of the recess 130 on the second insulating layer 120. The second conductive layer pattern 150 may be formed through an isotropic etching process. The second conductive layer pattern 150 may be included in a first gate electrode 176 (described below; refer to FIG. 8, for example). For example, the second conductive layer 151 may be etched by an etch-back process so that a portion of the second conductive layer 151 may remain at the bottom portion of the recess 130 to form the second conductive layer pattern 150 that partially fills up the recess 130.

A third insulating layer 161 may be conformally formed on the substrate 101 including the second conductive layer pattern 150. The third insulating layer may be formed using a silicon oxide compound. In accordance with example embodiments, the third insulating layer 161 including the silicon oxide compound may be formed through an atomic layer deposition (ALD) process.

A silicon precursor tetrakis ethyl methyl amino silane {Si[N(CH$_3$)C$_2$H$_5$]$_4$; TEMAS} may be used in the atomic layer deposition process. The silicon precursor may be introduced onto the substrate 101 including the second conductive layer pattern 150. A portion of the silicon precursor may be chemically adsorbed onto the substrate 101 and a portion of the silicon precursor may be physically adsorbed onto the substrate 101. An argon gas may be supplied onto the substrate 101 as a purging gas to remove the physically adsorbed silicon precursor.

Thereafter, an oxidizing agent may be introduced onto the substrate 101. The oxidizing agent may include ozone (O$_3$), water vapor (H$_2$O), hydrogen peroxide (H$_2$O$_2$), methanol (CH$_3$OH), ethanol (C$_2$H$_5$OH), etc. These compounds may be used alone or as a combination thereof. In an implementation, ozone (O$_3$) may be used as the oxidizing agent. For example, the oxidizing agent may be introduced onto the substrate 101 for about 1 to about 5 seconds. Silicon (Si) that is chemically adsorbed onto the substrate 101 may be oxidized by the introduced oxidizing agent.

The atomic layer process may be performed at a temperature range from about 150° C. to about 450° C. In accordance with the atomic layer process, the oxidation may be performed at a lower temperature than that for a common thermal oxidation process. When the first conductive layer 120 is formed using polysilicon, the crystallization of the first conductive layer 120 of polysilicon while performing the oxidation process for forming the third insulating layer 161 may be restrained.

In accordance with example embodiments, the third insulating layer 161 including silicon oxide may be formed through a thermal oxidation process. Examples of the thermal oxidation process may include a dry oxidation process, a wet oxidation process, a clean oxidation process, a radical oxidation process, etc. The third insulating layer 161 may be formed by at least one of the oxidation processes.

Figure 6:
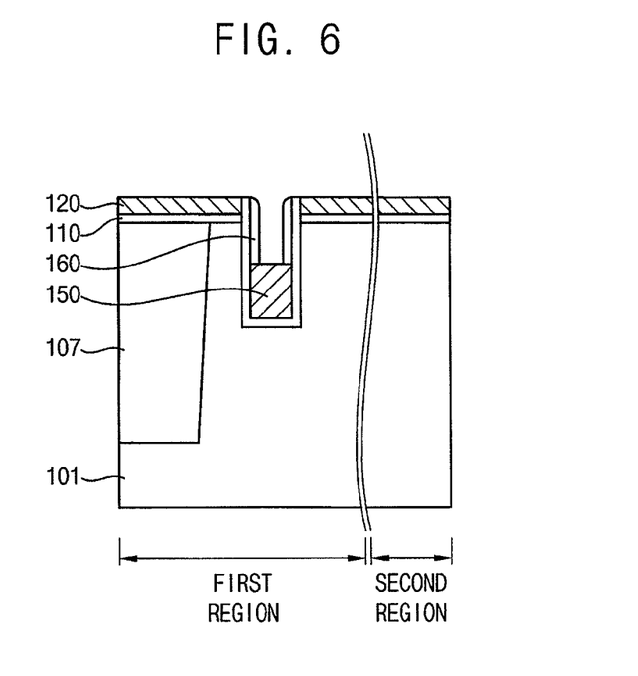

Referring to FIG. 6, the third insulating layer 161 may be anisotropically etched to form a third insulating layer pattern 160 on the upper sidewall of the recess 130. The third insulating layer pattern 160 may have a spacer structure and will be referred to hereinafter as a spacer 160. Also as shown in FIG. 6, the second insulating layer 140 may be etched such that only a portion of the second insulating layer conforming to the recess 130 remains.

The spacer 160 may be disposed between a first source/drain region 191 (refer to FIG. 8, for example) and a third conductive layer pattern 173 (refer to FIG. 8, for example) included in the first gate electrode, which are to be formed in following processes. A gate induced drain leakage current of the recess channel transistor may be reduced to improve an operating characteristic. A thickness of the second insulating layer pattern 140 functioning as a gate insulating layer in the channel region of the recess channel transistor may be relatively small. Thus, the on-current of the recess channel transistor may be increased to speed up the operating speed.

Figure 7:
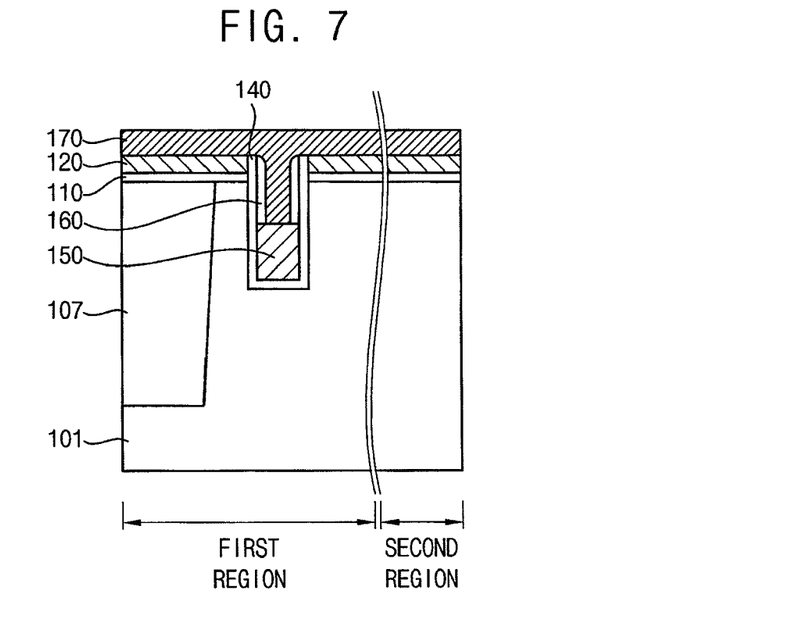

Referring to FIG. 7, a third conductive layer 170 may be formed in the first and second regions of the substrate 101 including on the spacer 160 to fill up the recess 130. The third conductive layer 170 may be formed using polysilicon. The third conductive layer 170 of polysilicon may be formed by a chemical vapor deposition process or a plasma enhanced chemical vapor deposition process. For example, the third conductive layer 170 may be formed by using a silane ($SiH_4$) gas and a phosphine ($PH_3$) gas at a temperature from about 450° C. to about 550° C. In another implementation, the third conductive layer 170 may be formed through a physical vapor deposition process such as a sputtering process.

Figure 8:
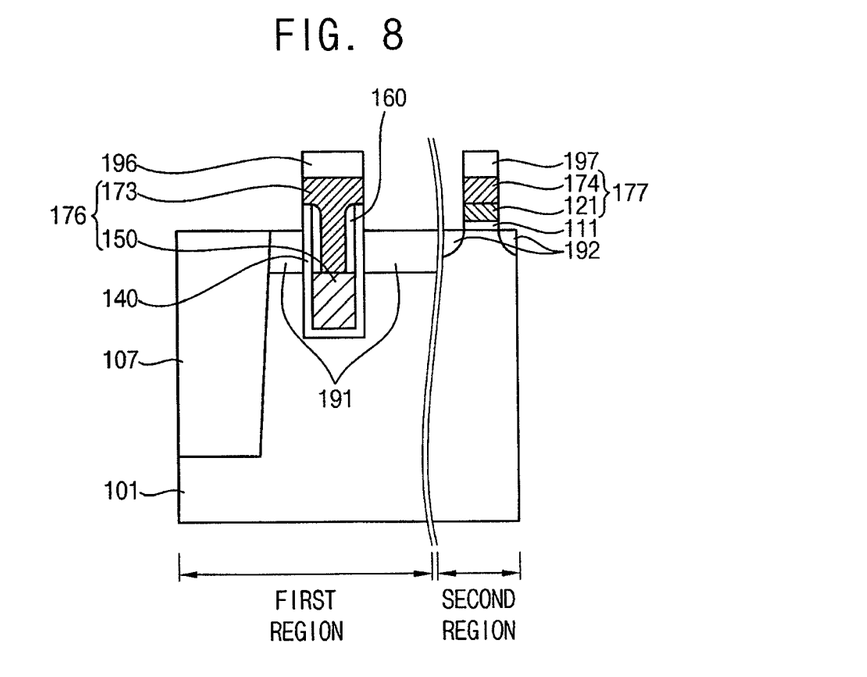

Referring to FIG. 8, hard mask patterns 196 and 197 may be formed on the third conductive layer 170. A portion of the third conductive layer 170 may be etched using the hard mask patterns 196 and 197 as an etching mask to form a third conductive layer pattern 173 in the first region and a fourth conductive layer pattern 174 in the second region of the substrate 101. A portion of the first conductive layer 120 may be etched using the hard mask patterns 196 and 197 as etching masks to remove the first conductive layer 120 from the first region and to form the first conductive layer pattern 121 in the second region.

The second conductive layer pattern 150 and the third conductive layer pattern 173 may form a first gate electrode 176 in the first region. The first conductive layer pattern 121 and the fourth conductive layer pattern 174 may form a second gate electrode 177 in the second region of the substrate 101. Using the hard mask patterns 196 and 197 as etching masks, the first insulating layer 110 may be removed from the first region and the first insulating layer pattern 111 may be formed in the second region. The first insulating layer pattern 111 formed in the second region may function as another gate insulating layer pattern. In accordance with the above-described process, a separate oxidation process for forming the gate insulating layer pattern in the second region may be omitted.

A first source/drain region 191 may be formed adjacent to the first gate electrode 176 in the first region and a second source/drain region 192 may be formed adjacent to the second gate electrode 177 in the second region of the substrate 101. The first and second source/drain regions 191 and 192 may be formed through a plasma doping process. Since the second insulating layer 140 (refer to FIG. 5, for example) and the spacer 160 (refer to FIG. 6, for example) may be formed through a low temperature oxidation process such as a plasma oxidation process and an atomic layer integration process, the crystallization of the first conductive layer 120 may be restrained. Therefore, the first conductive layer pattern 111 and the fourth conductive layer pattern 174 may have substantially the same polycrystalline structure and the execution of the plasma doping process may be facilitated.

In example embodiments, the first source/drain region 191 and the second source/drain region 192 may be formed through a substantially the same ion implantation process. In accordance with another example embodiment, the first source/drain region 191 and the second source/drain region 192 may be formed through performing separate ion implantation processes. An ion doping mask may be formed to expose only the first region of the substrate 101 and a first ion doping process may be performed to form the first source/drain region 191. Another ion doping mask may be formed to expose only the second region of the substrate 101 and a second ion doping process may be performed to form the second source/drain region 192.

Example Embodiment 2

Figure 9:
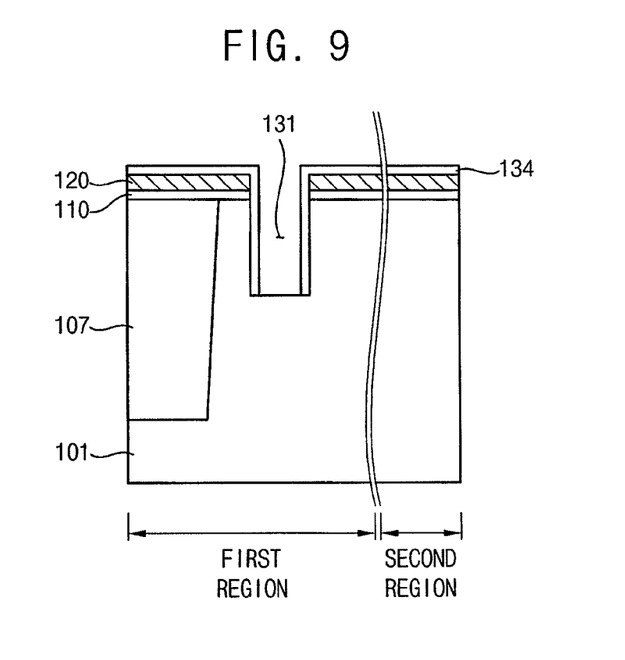
FIGS. 9 to 11 illustrate cross-sectional views relating to a method of manufacturing a recess channel transistor in accordance with Example Embodiment 2.
Figure 10:
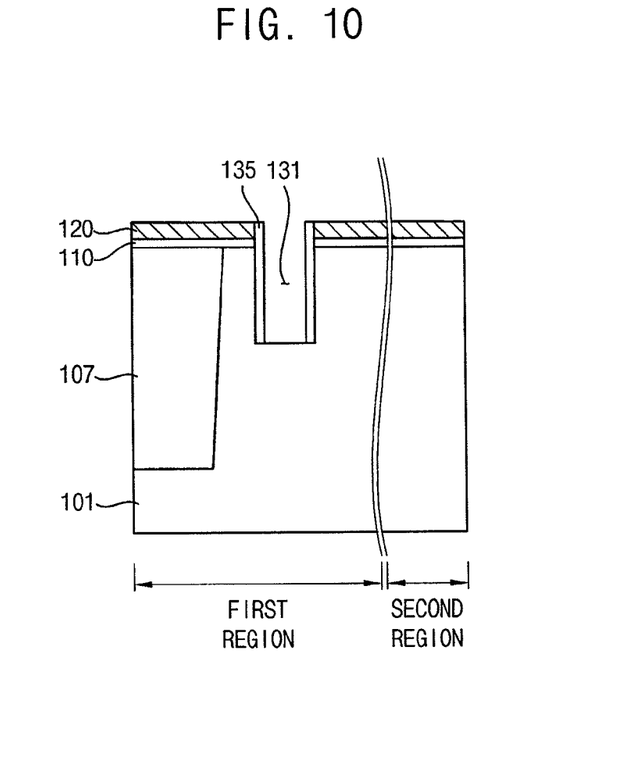
Figure 11:
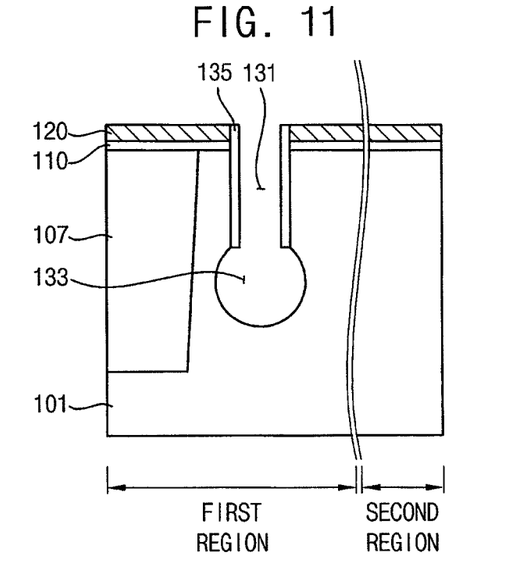

FIGS. 9 to 11 illustrate cross-sectional views relating to a method of manufacturing a recess channel transistor in accordance with Example Embodiment 2.

The method of manufacturing the recess channel transistor in accordance with Example Embodiment 2 is substantially the same as the method described with reference to FIGS. 1 to 8 except for the forming process of a recess structure. Therefore, the method of forming the recess structure will be explained hereinafter.

Referring to FIG. 9, a shallow trench isolation process may be performed on the substrate 101 to form a device isolation layer pattern 107 to define an active region and a device isolation region in the substrate 101. The active region may have an isolated island shape. The device isolation layer pattern 107 may surround the active region.

In the active region of the substrate 101 and on the device isolation layer pattern 107, a first insulating layer 110 and a first conductive layer 120 may be formed for exposing a portion of the substrate 101 in which the recess structure may be formed. The exposed portion by the first insulating layer 110 and the first conductive layer 120 may have a line shape crossing the active region.

A first recess 131 may be formed by performing a selective and anisotropic etching with respect to the active region of the substrate 101 using the first insulating layer 110 and the first conductive layer 120 as etching masks. The first recess 131 may be formed by a reactive ion etching process using an etching gas including chlorine (Cl). After forming the first recess 131, an additional cleaning process may be implemented to remove by-products generated during the reactive ion etching process.

A passivation layer 134 may be formed on the inner sidewall and the bottom of the first recess 131 and on the surface of the first conductive layer 120. The passivation layer 134 may be formed using a material having an etching selectivity with respect to the substrate 101. The passivation layer 134 may be formed using silicon oxide, silicon nitride, etc.

Referring to FIG. 10, the passivation layer 134 may be etched by an etch-back process, to form a passivation layer pattern 135 covering the sidewall of the first recess 131. For example, the passivation layer may be etched such that only the passivation layer pattern covering the sidewall of the first recess 131 remains of the passivation layer.

Referring to FIG. 11, the substrate 101 in the bottom portion of the first recess 131 may be etched using the passivation layer pattern 135 as an etching mask to form a second recess 133 connected with the first recess 131. In the first region of the substrate 101, a recess structure including the first and second recesses 131 and 133 may be formed. The second recess 133 may be formed through an isotropic etching process. Particularly, the second recess 133 may be formed by an isotropic dry etching process using an etching gas including sulfur hexafluoride ($SF_6$), a chlorine gas ($Cl_2$) and an oxygen gas ($O_2$).

In this case, the isotropic etching process may be performed so that a second width of the second recess 133 may be substantially larger than a first width of the first recess 131. In a cross-sectional view of the second recess 133 formed through the isotropic etching process, the second recess 133 may appear to be substantially circular (refer to FIG. 11, for example).

Substantially similar or the same process described with reference to FIGS. 4 to 8 may be applied to form transistors in the first and second regions of the substrate 101.

Example Embodiment 3

Figure 12:
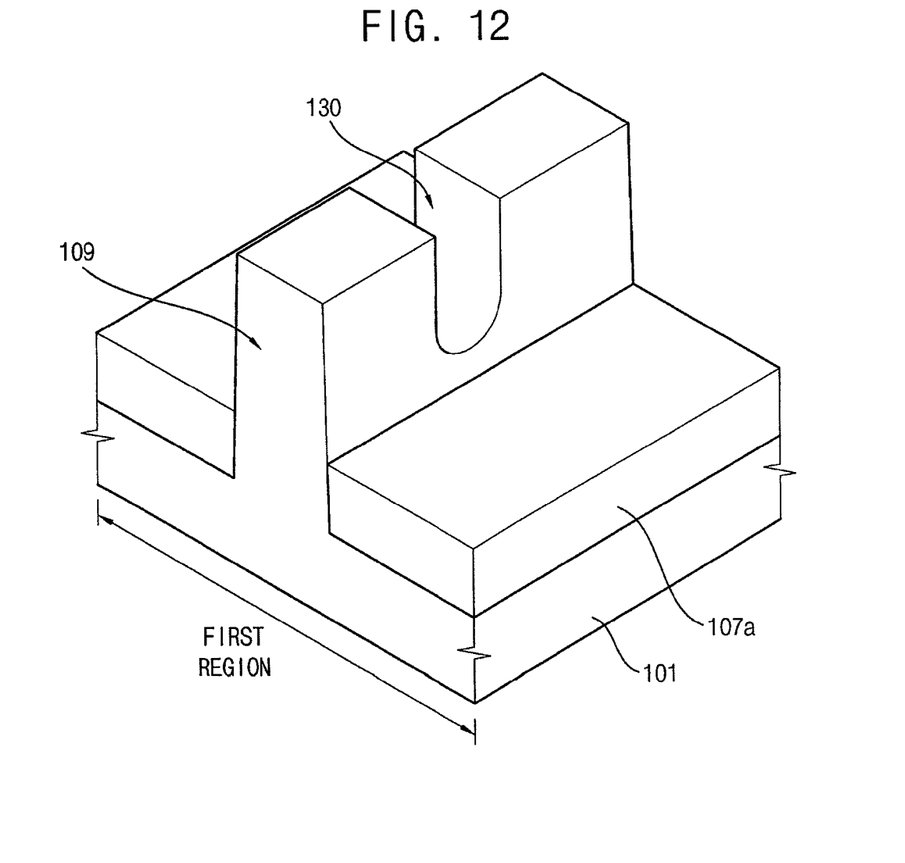
FIG. 12 illustrates a perspective view relating to an active fin and a device isolation pattern in accordance with Example Embodiment 3.
Figure 13:
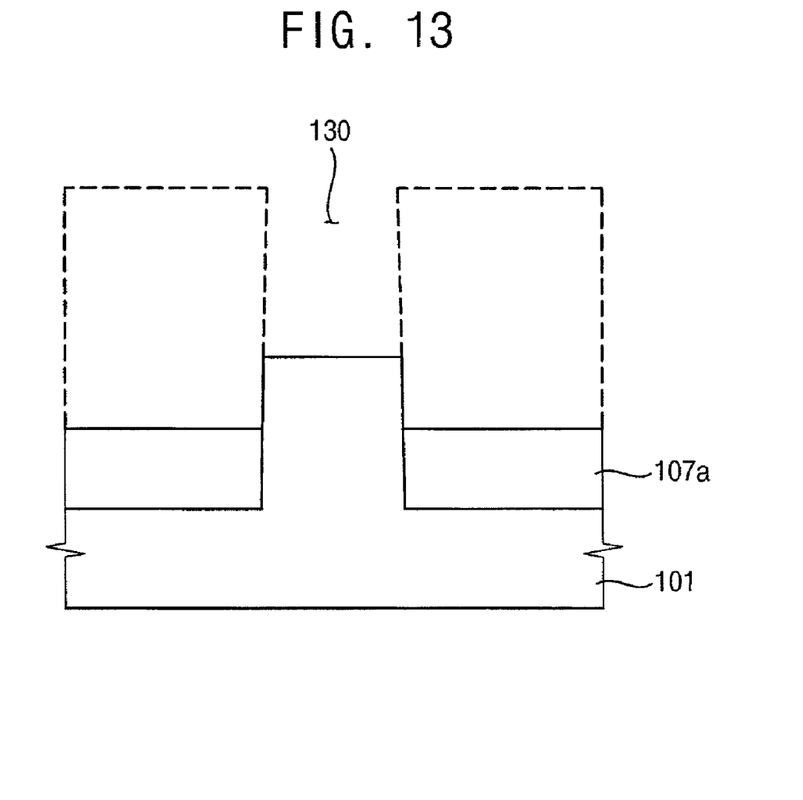
FIG. 13 illustrates a cross-sectional view for explaining a method of manufacturing a transistor illustrated in FIG. 12 in accordance with Example Embodiment 3.

FIG. 12 illustrates a perspective view relating to an active fin and a device isolation pattern in accordance with Example Embodiment 3. FIG. 13 illustrates a cross-sectional view to explain a method of manufacturing a transistor illustrated in FIG. 12 in accordance with Example Embodiment 3.

The transistor in accordance with Example Embodiment 3 is a saddle-type Fin Field Effect Transistor (saddle-Fin FET), in which a channel may be formed on the upper surface and a sidewall portion of the active fin, and is a recess channel transistor including a recess channel.

The cross-sectional shape along an active extended direction of the transistor may be substantially the same as that of the recess channel transistor explained referring to FIG. 8 in accordance with Example Embodiment 1. However, the cross-sectional view along the extended direction of the gate electrode may be different from that of the recess channel transistor in accordance with Example Embodiment 1. Therefore, different elements from the recess channel transistor in accordance with Example Embodiment 1 will be explained in detail.

Except that a removing process of a portion of a device isolation layer pattern may be additionally performed after forming a recess in a substrate in accordance with Example Embodiment 3, the remaining processes may be substantially the same as the method of manufacturing the recess channel transistor in accordance with Example Embodiment 1. Therefore, the same reference numerals may be given to the same elements of the transistor explained in accordance with Example Embodiment 1 and an explanation on the elements may be omitted. Different parts from the constituting elements of the recess channel transistor in accordance with Example Embodiment 1 may be explained in detail.

Substantially the same or similar processes with the processes explained referring to FIGS. 1 and 2 may be performed to form a preliminary device isolation layer pattern 107 and a recess 130 in the substrate 101.

Referring to FIGS. 12 and 13, a portion of the preliminary device isolation layer pattern 107 may be etched to form a device isolation layer pattern 107a having a upper surface that is lower than the recess 130.

For example, the whole surface of the preliminary device isolation layer pattern 107 may be etched to form a device isolation layer pattern 107a having a planar upper surface. In another implementation, only a portion of the preliminary device isolation layer pattern making contact with the recess 130 may be selectively etched to form the device isolation layer pattern 107a. In this case, the neighboring portion of the device isolation layer pattern 152a with the recess 130 may have the upper surface that is lower than the recess 130.

Then, substantially the same or similar processes as those explained referring to FIGS. 3 to 8 may be performed to form transistors in the first and second regions of the substrate 101, respectively.

According to example embodiments of the method of forming a conductive layer structure and the method of manufacturing a recess channel transistor described above, a lower portion of the recess may be filled with a conductive material, a spacer may be formed on upper sidewall portions of the recess and the upper portion of the recess including the spacer may be additionally filled up with the conductive material. The inner space portion of the recess may be filled with the conductive material without generating any voids to improve an electric characteristic of the transistor. Since a first insulating layer and a first conductive layer may be formed subsequently in both of first and second regions, an additional oxidation process for forming a gate insulating layer in the second region may be omitted. Further, the second insulating layer and the spacer may be formed through a low temperature oxidation process and the generation of an additional crystallization of the first conductive layer, which may possibly occur during the oxidation process, may be suppressed. Therefore, an etching process of the first conductive layer to form a gate electrode in the second region and a plasma doping process performed on the first conductive layer for forming a second source/drain region in an upper portion of the second region may be easily carried out.

Figure 14:
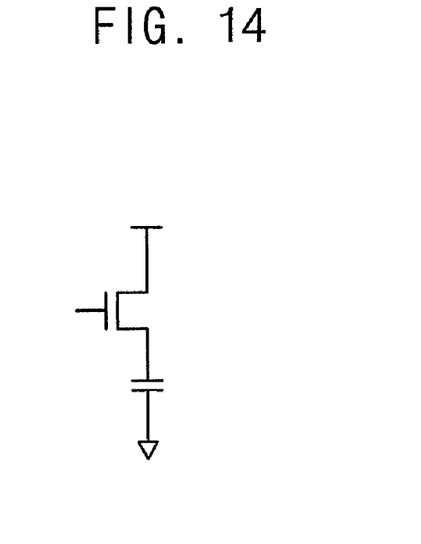
FIG. 14 illustrates a circuit diagram of a cell of a DRAM device including a recess channel transistor in accordance with example embodiments.

FIG. 14 illustrates a circuit diagram of a cell of a DRAM device including a recess channel transistor in accordance with example embodiments.

Referring to FIG. 14, the DRAM cell may include a MOS transistor and a capacitor. The MOS transistor may be one of the recess channel transistors in accordance with example embodiments described above. The MOS transistors included in the peripheral circuit region of the DRAM device may be one of the planar transistors in accordance with example embodiments.

Figure 15:
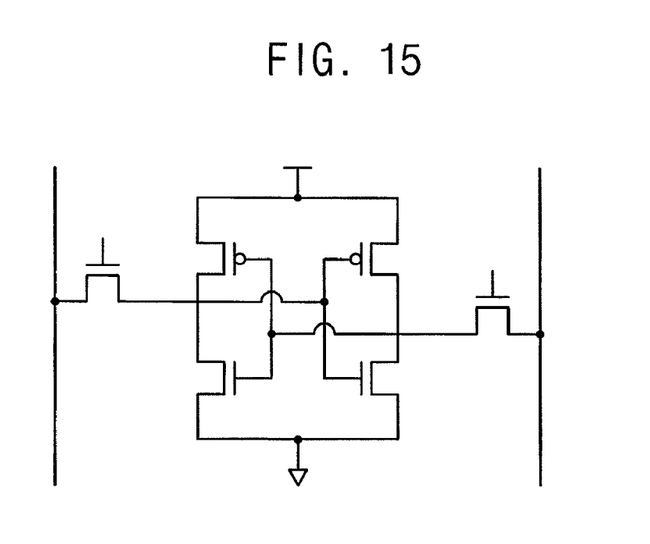
FIG. 15 illustrates a circuit diagram of a cell of an SRAM device including a recess channel transistor in accordance with example embodiments.

FIG. 15 illustrates a circuit diagram of a cell of an SRAM device including a transistor in accordance with example embodiments.

Referring to FIG. 15, the SRAM cell may include an NMOS transistor and a PMOS transistor. Each of the NMOS transistor and the PMOS transistor may be formed by performing one of substantially the same methods of manufacturing the recess channel transistors in accordance with example embodiments.

Figure 16:
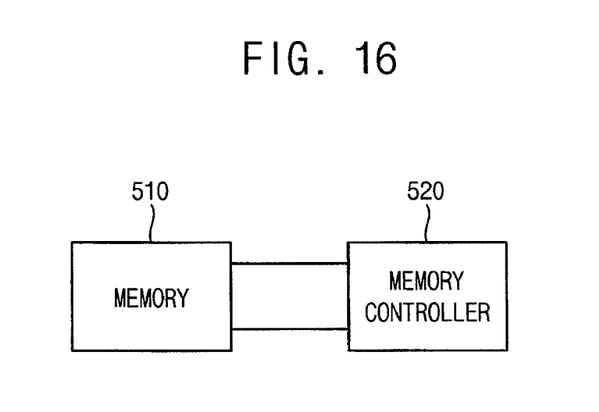
FIG. 16 illustrates a block diagram relating to an electronic device including a recess channel transistor in accordance with example embodiments.

FIG. 16 illustrates a block diagram relating to an electronic device including a recess channel transistor in accordance with example embodiments.

Referring to FIG. 16, the electronic device may include a memory 510 connected with a memory controller 520. The memory 510 may include a recess channel transistor manufactured by performing a method in accordance with at least one of the above-described example embodiments. In addition, a planar transistor having the structure formed in accordance with example embodiments may be included in the peripheral region of the memory.

The memory controller 520 may provide an input signal for controlling an operation of the memory 510. For example, the memory controller 520 may provide an input signal of the DRAM device including a command (CMD) signal, an address (ADD) signal and an I/O signal. The memory controller 520 may control data of the DRAM device based on the input signal.

Figure 17:
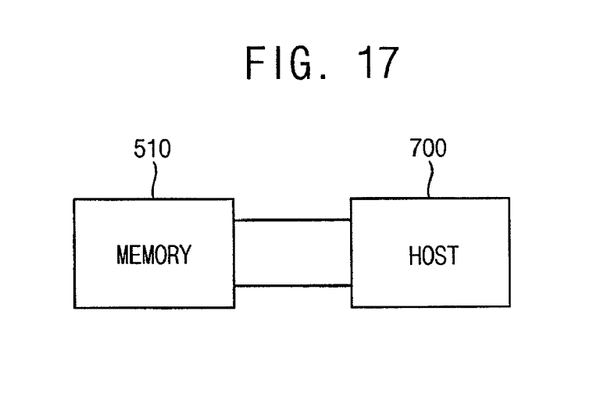
FIG. 17 illustrates a block diagram relating to another electronic device including a recess channel transistor in accordance with example embodiments.

FIG. 17 illustrates a block diagram relating to another electronic device including a recess channel transistor formed in accordance with example embodiments.

Referring to FIG. 17, the electronic device may include a memory 510 connected with a host system 700. The memory 510 may include a recess channel transistor having a structure formed in accordance with at least one of the above-described example embodiments. In addition, a planar transistor having a structure in accordance with one of the above-described example embodiments may be included in the peripheral circuit region of the memory 510.

The host system 700 may include an electronic appliance such as a personal computer, a camera, a mobile device, a game machine, a telecommunication device, etc. The host system 700 may apply an input signal for controlling and operating the memory 510. The memory 510 may be used as a data storing medium.

Figure 18:
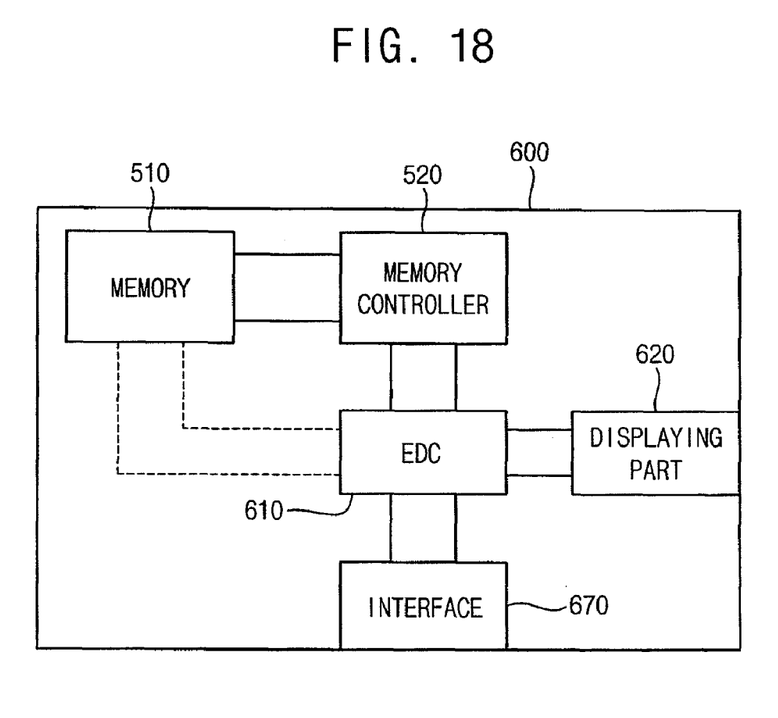
FIG. 18 illustrates a block diagram relating to another electronic device including a recess channel transistor in accordance with example embodiments.

FIG. 18 illustrates a block diagram relating to another electronic device including a recess channel transistor formed in accordance with example embodiments.

The electronic device may include a portable device 600. The portable device 600 may include an MP3 player, a video player, a complex device of a video and audio player, etc. The portable device 600 may include a memory 510 and a memory controller 520 as illustrated in FIG. 18. The memory 510 may include a recess channel transistor formed in accordance with one of the above-described example embodiments. A planar transistor having a structure formed in accordance with one of the above-described example embodiments may be included in the peripheral region of the memory 510. The portable device 600 may include an encoder/decoder 610, a displaying part 620 and an interface 670. Data of audio, video, etc., may be input/output from the memory 510 through the memory controller 520.

Figure 19:
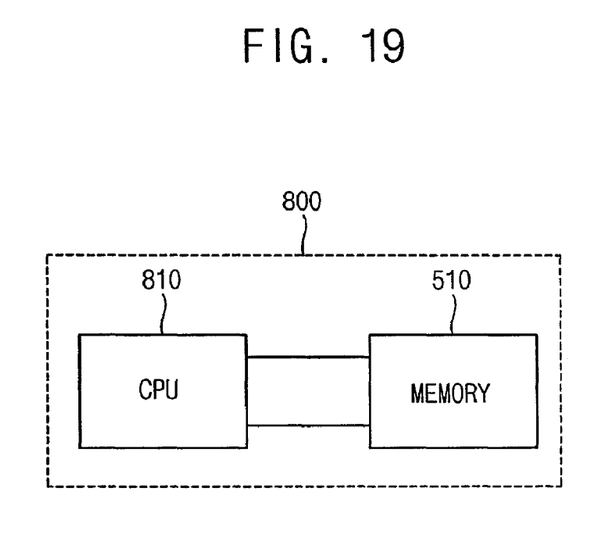
FIG. 19 illustrates a block diagram relating to another electronic device including a recess channel transistor in accordance with example embodiments.

FIG. 19 is a block diagram illustrating another electronic device including a recess channel transistor formed in accordance with example embodiments.

Referring to FIG. 19, a memory 510 may be connected with a central processing unit (CPU) 810 in a computer system 800. The computer system 800 may include a personal computer, a personal data assistant, etc. The memory 510 may be connected to the CPU 810 directly or via a bus. The memory 510 may include a recess channel transistor in accordance with one of the above-described example embodiments. A planar transistor having a structure in accordance with one of the above-described example embodiments may be included in the peripheral region of the memory 510. Even though each element is not fully illustrated in FIG. 19, additional elements may be included in the computer system 800.

In accordance with example embodiments, various transistors having a three-dimensional structure may be applicable. For example, the gate oxide layer in accordance with example embodiments may be applied to a gate oxide layer of a recess channel transistor, a saddle transistor, a saddle fin transistor, a recessed fin transistor, etc.

As described above, a method of forming a conductive layer structure and a method of manufacturing a recess channel transistor in accordance with example embodiments may be applied to a manufacturing method of transistors in a DRAM cell region and a peripheral circuit region. The method of manufacturing the recess channel transistor in accordance with example embodiments may be also applied to a manufacturing method of an SRAM device. Further, a selection transistor of a semiconductor device having a high integration and a high performance may be accomplished through the method of manufacturing the recess channel transistor in accordance with example embodiments.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a conductive layer structure, the method comprising:
    sequentially forming a first insulating layer and a first conductive layer on a substrate having a first region and a second region, and exposing the substrate in a recess-forming area in the first region;
    forming a recess in the recess-forming-area by etching the substrate that is exposed in the recess-forming area;
    conformally forming a second insulating layer on the first conductive layer and on a sidewall and a bottom of the recess, wherein the second insulating layer is formed of silicon oxide by a plasma oxidation process using at least one oxidizing agent including at least one of oxygen, nitric oxide (NO) and nitrous oxide ($N_2O$) and at least one plasma generating gas including at least one of argon, helium and xenon;
    forming a second conductive layer pattern on the second insulating layer to fill up a portion of the recess;
    forming a spacer on the second conductive layer pattern and on the second insulating layer on the sidewall of the recess; and
    forming a third conductive layer pattern on the second conductive layer pattern and the spacer to fill up the recess.

2. The method as claimed in claim 1, wherein the plasma oxidation process is performed at a temperature range from a room temperature to about 550° C. and at a pressure range from about 0.01 torr to about 50 torr.

3. The method as claimed in claim 1, wherein forming the spacer comprises:
    conformally forming a third insulating layer on the substrate including the second conductive layer pattern; and
    forming the spacer on an upper sidewall of the recess by anisotropically etching the third insulating layer until an upper surface of the second conductive layer pattern is exposed, and wherein the method further comprises etching a portion of the second insulation layer formed on the first conductive layer to expose the first conductive layer.

4. The method as claimed in claim 1, further comprising patterning the first conductive layer to remove a portion of the first conductive layer formed in the first region and to form a first conductive layer pattern in the second region.

5. The method as claimed in claim 1, wherein forming the second conductive layer pattern comprises:
    forming a second conductive layer on the second insulating layer to fill up the recess; and
    partially etching the second conductive layer to remove a portion of the second conductive layer formed in the second region and to form the second conductive layer pattern in the first region.

6. A method of manufacturing a recess channel transistor, the method comprising:
    sequentially forming a first insulating layer and a first conductive layer on a substrate having a first region and a second region, and exposing the substrate in a recess-forming area in the first region;
    forming a recess in the recess-forming-area by etching the substrate that is exposed in the recess-forming area;
    conformally forming a second insulating layer on the first conductive layer and on a sidewall and a bottom of the recess;

forming a second conductive layer pattern on the second insulating layer to fill up a portion of the recess, wherein the second insulating layer is a silicon oxide layer formed by a plasma oxidation process;

forming a spacer on the second conductive layer pattern and on the second insulating layer on the sidewall of the recess;

filling up the recess with a third conductive layer;

patterning the third conductive layer and the first conductive layer to form a first gate electrode including the second conductive layer pattern and a third conductive layer pattern in the first region and to form a second gate electrode including a first conductive layer pattern and a fourth conductive layer pattern in the second region; and forming a first source/drain region and a second source/drain region adjacent to the first gate electrode and the second gate electrode, respectively.

7. The method as claimed in claim 6, wherein the forming of the spacer comprises:

conformally forming a third insulating layer on the substrate including on the second conductive layer pattern; and anisotropically etching the third insulating layer until an upper surface of the second conductive layer pattern is exposed to form the spacer on an upper sidewall of the recess, and wherein the method further comprises etching a portion of the second insulation layer formed on the first conductive layer to expose the first conductive layer.

8. The method as claimed in claim 6, further comprising:

forming a preliminary device isolation layer pattern to define an active region and a field region in the first region; and etching the preliminary device isolation layer pattern to form a device isolation layer pattern having an upper surface lower than the bottom surface of the recess.

9. The method as claimed in claim 6, wherein the recess includes a first recess having a first width and a second recess having a second width larger than the first width and connected with the first recess.

10. The method as claimed in claim 9, wherein the forming of the recess comprises:

forming the first recess in the recess-forming-area;

forming a passivation layer pattern on an inner sidewall of the first recess and on the first conductive layer; and etching the substrate at the bottom portion of the first recess using the passivation layer pattern as an etching mask to form the second recess.

11. The method as claimed in claim 10, wherein the forming of the passivation layer pattern comprises:

forming a passivation layer on the inner sidewall of the first recess and on the first conductive layer; and etching the passivation layer through an etch-back process.

12. The method as claimed in claim 11, wherein the passivation layer includes at least one of silicon oxide and silicon nitride.

13. The method as claimed in claim 10, wherein the first recess is formed by a reactive ion etching process.

14. The method as claimed in claim 10, wherein the second recess is formed by an isotropic etching process.

15. The method as claimed in claim 6, wherein the plasma oxidation process is performed by using at least one oxidizing agent including at least one of oxygen, nitric oxide (NO) and nitrous oxide ($N_2O$) and at least one plasma generating gas including at least one of argon, helium and xenon.

16. The method as claimed in claim 6, wherein the plasma oxidation process is performed at a temperature range from a room temperature to about 550° C. and at a pressure range from about 0.01 torr to about 50 torr.

17. The method as claimed in claim 6, further comprising removing a portion of the first insulating layer after patterning the third conductive layer and the first conductive layer to form a second gate insulating layer pattern in the second region.

18. The method as claimed in claim 6, wherein each of the first source/drain region and the second source/drain region is formed by a plasma doping process.

* * * * *